U S 0 0 8 8 7 8 4 5 6 B 2

US008878456B2

(12) United States Patent
Holzinger et al.

(10) Patent No.: US 8,878,456 B2
(45) Date of Patent: Nov. 4, 2014

(54) FILTER DEVICE

(75) Inventors: Stefan Holzinger, Vienna (AT); Christian Stöger, Vienna (AT)

(73) Assignee: Continental Automotive GmbH, Hannover (DE)

( * ) Notice: Subject to any disclaimer, the term of this patent is extended or adjusted under 35 U.S.C. 154(b) by 650 days.

(21) Appl. No.: 12/999,906

(22) PCT Filed: Jun. 5, 2009

(86) PCT No.: PCT/EP2009/056927
§ 371 (c)(1),
(2), (4) Date: Dec. 17, 2010

(87) PCT Pub. No.: WO2009/153173
PCT Pub. Date: Dec. 23, 2009

(65) Prior Publication Data
US 2011/0095705 A1    Apr. 28, 2011

(30) Foreign Application Priority Data

Jun. 20, 2008   (DE) .................. 10 2008 029 478

(51) Int. Cl.
*H05B 41/36*   (2006.01)
*H03H 7/01*    (2006.01)

(52) U.S. Cl.
CPC .................. *H03H 7/0115* (2013.01)
USPC ........... 315/294; 315/247; 315/291; 315/297; 315/307; 315/308; 363/16; 363/21.01; 363/24; 363/25; 363/26

(58) Field of Classification Search
USPC ............ 315/247, 291, 294, 297, 307, 308; 323/266, 268, 271, 282, 285, 299; 363/16, 21.01, 24, 25, 26
See application file for complete search history.

(56) References Cited

U.S. PATENT DOCUMENTS

| | | | | |
|---|---|---|---|---|
| 4,779,185 | A | * | 10/1988 | Musil ................ 363/73 |
| 6,677,834 | B1 | | 1/2004 | Rafalczik et al. ............. 333/181 |
| 2006/0261754 | A1 | * | 11/2006 | Lee ................ 315/291 |
| 2008/0130322 | A1 | * | 6/2008 | Artusi et al. ............... 363/21.01 |

FOREIGN PATENT DOCUMENTS

| | | | |
|---|---|---|---|
| DE | 19847014 A1 | 4/2000 | ............. H03H 7/06 |
| DE | 10221631 A1 | 12/2003 | ............. H01G 4/40 |
| JE | 9247941 A | 9/1997 | ............. H02M 1/08 |
| JE | 2004222478 A | 8/2004 | ............. H02M 7/12 |
| JP | 3676873 B2 | 7/2005 | ............. H02M 1/08 |
| WF | 03/005578 A1 | 1/2003 | ............. H03H 7/00 |

OTHER PUBLICATIONS

International PCT search Report and Written Opinion PCT/EP2009/056927, 13 pages.

* cited by examiner

*Primary Examiner* — Douglas W Owens
*Assistant Examiner* — Thai Pham
(74) *Attorney, Agent, or Firm* — King & Spalding L.L.P.

(57) ABSTRACT

A filter device (10) for filtering high-frequency interferences, such as due to switching flanks of a DC converter, has a current path (4) between an input (2) and an output (3), and an inductor (L) in the current path (4), wherein the inductor (L) is disposed in the current path (4) as a first component and is connected to the input (2), and wherein a reverse polarity protective diode (D) is disposed in series with the inductor (L) downstream thereto.

9 Claims, 1 Drawing Sheet

FILTER DEVICE

CROSS-REFERENCE TO RELATED APPLICATIONS

This application is a U.S. National Stage Application of International Application No. PCT/EP2009/056927 filed Jun. 5, 2009, which designates the United States of America, and claims priority to German Application No. 10 2008 029 478.0 filed Jun. 20, 2008, the contents of which are hereby incorporated by reference in their entirety.

TECHNICAL FIELD

The invention relates to a filter device for filtering high-frequency interference, caused e.g. by switching edges of a direct current converter, said filter device having a current path between an input and an output, and having an inductor in the current path.

The invention further relates to a control module having a filter device of said kind.

BACKGROUND

It is known to employ a monitoring unit for the purpose of monitoring current-consuming loads in respect of their electricity consumption in order thereby to deduce from interruptions of the load current or generally in the event of predefined threshold values being undershot or exceeded that a malfunction has occurred among the loads. Thus, for example, it is usual in the case of motorized vehicles to use a central control device (also known as a body control unit (BCU)) for controlling various lights of the motorized vehicle, front lights and tail lights for example, and in the process for establishing on the basis of the electricity consumption, i.e. of the load current, whether the lights are functioning properly or not. For this purpose a lower threshold is defined for the load current.

More recently there has been an increasing trend toward replacing the incandescent or halogen lamps etc. used hitherto for lights of said type by alternative lighting means, such as in particular LEDs (light-emitting diodes). This reduces electricity consumption and correspondingly, in the case of current monitoring for the purpose of fault detection, the load current thresholds for fault detection are set lower.

The lamps, in particular also LEDs, are typically controlled by means of direct current converters, referred to hereinbelow as DC/DC converters for short. A DC/DC converter of said kind is mostly accommodated in a separate control module that is arranged between the central control device, the BCU, and the loads, i.e. LEDs. During operation, (higher-frequency) electromagnetic interference, caused, for instance, by the DC/DC converter, can be produced in this area and, if no other measures are taken, can reach the vehicle electrical system. The proper operation of other control devices can be compromised by said sources of interference, and interference signals can also be emitted into the environment via cables acting as antennas. Filter devices of the kind to which the invention relates are used in order to prevent said interference as effectively as possible. It can nonetheless happen that the current to the filter device or, as the case may be, to the load becomes discontinuous without a malfunction of the load being present, as a result of which it becomes difficult for the central control device, the BCU, to differentiate the case of proper operation from a fault situation.

A discontinuous current can be attributable in particular to the following causes:
1. the DC/DC converter "misses", which is to say that the current is not consumed continuously, constantly returning to 0 under certain conditions.
2. the filter elements used at the input in the filter device store energy and feed current back into the onboard electrical system of the motorized vehicle when fluctuations occur in said system.

In both cases the control device (the BCU) could diagnose a line break.

In order to solve the problem of the discontinuously operating DC/DC converter, a suitable topology can simply be chosen and at the same time it can be ensured that the input current remains essentially constant.

SUMMARY

According to an embodiment, a filter device for filtering high-frequency interference may have a current path between an input and an output, and an inductor in the current path, wherein the inductor may be provided as the first component in the current path and may be connected to the input.

According to a further embodiment, an inverse-polarity protection diode can be connected in series with and downstream of the inductor. According to a further embodiment, a capacitor acting as a voltage buffer and bypass capacitor can be connected downstream of the protection diode. According to a further embodiment, a filter capacitor can be connected to the input-side terminal of the inductor and may define a branch path of the filter device. According to a further embodiment, a further filter capacitor can be provided in a further branch path of the filter device connecting to the current path downstream of the inductor. According to a further embodiment, the further filter capacitor can be connected at the downstream end of the protection diode. According to a further embodiment, a resistor guaranteeing a minimum current may be connected to the filter device.

According to another embodiment, a control module may have a filter device as described above and may have a DC/DC converter that is connected to the output of the filter device.

BRIEF DESCRIPTION OF THE DRAWINGS

The invention is explained in still further detail below with the aid of an exemplary embodiment, although it is not to be restricted thereto, and with reference to the drawings, in which.

DETAILED DESCRIPTION

Figure 1:
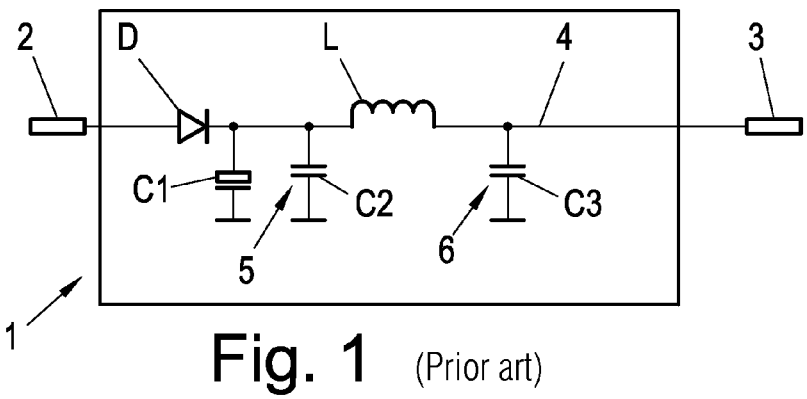
FIG. 1 shows a circuit diagram of a conventional filter device complete with inverse-polarity protection diode.

According to various embodiments, a minimum current draw can be provided even under specific operating conditions, for example when vehicle electrical system fluctuations occur and energy from the filter elements is fed back into the vehicle electrical system. Another factor to be taken into account in this context is that the current shall not fall below a minimum current. In order to guarantee this minimum current a resistor is connected into the circuit. However, said resistor is to be activated only when necessary, firstly in order to keep the thermal load (in the order of magnitude of approx. 2 watts nonetheless) within limits and secondly in order to degrade the overall level of efficiency only to a negligible extent.

The above-cited resistor is activated in cases of a rapidly dropping supply voltage. Then, however, there arises the non-trivial problem that an activation of the resistor of this kind is not possible within an infinitely short period of time; estimated switching times in this instance are one to two microseconds, for example. If the central control device, i.e. a BCU for example, now measures the current consumption at precisely such a switching time instant, a fault disconnection will be initiated—in error—, and this must be avoided. Another potential fault source arises as a result of the fact that a DC/DC converter delivers an approximately constant power output to the lights, a constant current generally being supplied. If the input voltage now increases, the input current to the light decreases. If said input current now falls below the predefined threshold, the resistor is activated, in turn resulting in the problem of the necessary switching time, as mentioned hereintofore. Yet another problem can reside in the superimposition of sinusoidal oscillations or other periodic signals, where it can happen that the resistor is activated cyclically when repeated downward jumps of the current occur. Since a certain time lag is incorporated, a continuous activation of the resistor can result in extreme cases, leading to a permanent additional load.

According to various embodiments, a filter device of the type referred to in the introduction can be provided, by means of which an adequate current draw is ensured, and moreover also during the time of activation of a resistor as mentioned previously, in order thereby to prevent a possible erroneous detection of a fault by a central control device. In particular it is aimed therein to keep the input current—at least in the short term—as constant as possible.

According to further embodiments, a control module can be provided having such a filter device and having a DC/DC converter, the DC/DC converter being connected to the output of the filter device. A control module of this kind can be arranged between the aforementioned central control device and the loads, in particular an LED array, and it also preferably includes the resistor which can be activated to ensure a minimum current.

With the aid of the coil or, as the case may be, inductor as the first component in the present filter device the minimum current can be successfully ensured under all conditions. It is a particular advantage in this case that in comparison with prior art solutions the embodiment of the filter device according to various embodiments provides a satisfactory implementation without need for additional components. The elements of the filter device are merely rearranged, which means that the modification remains cost-neutral. Because the inductor is present as the first component in the filter device it always remains active and keeps the current sufficiently constant.

As a result the central control device (the BCU) is able to make reliable diagnoses at all times and erroneous fault disconnections are avoided. The in-series rearrangement of a preferably provided inverse-polarity protection diode to a position downstream of the inductor means that its protective function in terms of an incorrect connection of the filter device or, as the case may be, the control module provided with such a filter device is not compromised. In this context it is also favorable if a filter capacitor having a relatively small capacitance and also having a small ohmic value (equivalent series resistance (ESR)) is provided on the input side. In the case of a greater capacitance this would instantly cause current to be fed back into the vehicle electrical system at the time of the voltage jump. A comparatively small capacitance of the filter capacitor at the input is also beneficial in the case of the present filter device if the diode protecting against a polarity reversal no longer protects the capacitor (because it is arranged after the inductor), since the small capacitance allows the use of a ceramic package format which suffers no damage in the event of a polarity reversal.

However, a capacitor serving as a voltage buffer and bypass capacitor, in particular an electrolytic capacitor, having a relatively large capacitance (and comparatively high resistance value (ESR)) is connected in the current path downstream of the inductor or protection diode so that it a) cannot feed back current into the vehicle electrical system if a voltage jump occurs at the input of the filter device and b) is protected against a polarity reversal. Said capacitor acting as a voltage buffer can additionally be supported by means of a downstream filter capacitor, the latter having a comparatively small capacitance and ESR value, in a further branch path of the filter device, for the purpose of suppressing sources of high-frequency interference.

Providing the inverse-polarity protection diode in the current flow direction after the inductor nonetheless prevents the inductor from being discharged too rapidly in the event of voltage dips at the input, namely when a capacitor having a higher capacitance and acting as a voltage buffer is connected downstream thereof. Without the protection diode, a voltage dip at the input of the filter device would—given appropriate dimensioning—cause a discharge to take place from said capacitor having a high capacitance value across the inductor to the input, as a result of which the input current would become negative. With the protection diode being present, said voltage buffer capacitor becomes ineffective if a voltage dip occurs at the input, if the reverse blocking current of the protection diode is disregarded, and the inductor can act fully in the interests of keeping the current in the current path constant; the input current then decreases only slowly and never becomes negative.

The resistor guaranteeing a minimum current is preferably connected at the input of the filter device, though it can also be positioned at the output of the filter device. In addition, an—in particular electronic—switch is assigned to the resistor in order, as mentioned, to connect and activate said resistor when necessary, and then disconnect and deactivate it again. By means of the embodiment of the filter device the current is kept sufficiently positive at all times until said resistor is reliably activated. When it is deactivated, a certain time lag (several ms) is preferably allowed to elapse so that the associated detector circuit can level out (settle into a steady state) in order then to be ready for the next current drop.

Tests have revealed that at no time did currents under the predefined minimum current level occur with the present filter device, whereas in the case of a conventional filter device too small, even negative, currents occurred repeatedly.

FIG. 1 shows a filter device 1 according to the prior art in which an inverse-polarity protection diode D and an inductor L are connected in series between an input 2 and an output 3 in a current path 4. A capacitor C1 having a relatively high capacitance value, e.g. an electrolytic capacitor having a capacitance of 220 $\mu F$, and acting as a voltage buffer and bypass capacitor is connected to the cathode of the protection diode D. The actual filter circuit, in this case in the form of a $\pi$ circuit, additionally includes an input-side filter capacitor C2 and an output-side filter capacitor C3, each having a comparatively small capacitance value, e.g. 4, 7 $\mu F$, which are arranged at the input-side end of the inductor L and at the output-side end in the branch paths 5 and 6, respectively. The capacitors C2, C3 have a low ESR value, e.g. of 1 mΩ, whereas the voltage buffer capacitor C1 has a relatively high ESR value, in the order of magnitude of several 100 mΩ. The inductor or coil L has an inductance value of 10 μH, for example.

Figure 2:
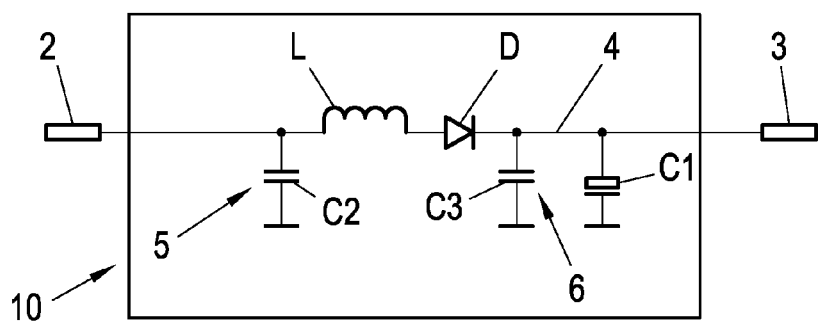
FIG. 2 shows a corresponding circuit diagram of a filter device according to an embodiment.

In the filter device 10 according to FIG. 2, the same components as shown in FIG. 1 are provided (and accordingly labeled with the same reference signs), though they are present in a modified arrangement by comparison therewith. The inductor L is now the first component in the current path 4, disregarding the arrangement of the filter capacitor C2 in a first branch path 5 at the input-side terminal of the inductor L. Viewed in the normal current flow direction, i.e. in the direction from the input 2 to the output 3, the protection diode D protecting against a polarity reversal is arranged downstream of the inductor L, and downstream of this in turn is the branch path 6 having the further filter capacitor C3. Connected downstream of this in turn and in parallel with the further filter capacitor C3 is the electrolytic voltage buffer and bypass capacitor C1 having a comparatively high capacitance value. It is, however, also possible to arrange the diode D between the capacitors C3 and C1 in the current path 4.

When used, for example, for attenuating alternating current components in the power supply for LED arrays in motorized vehicle applications, the individual components can have the same dimensions as explained in connection with FIG. 1; the filter capacitors C2, C3 can be ceramic capacitors, whereas the capacitor C1 is an electrolytic capacitor. The capacitors C2, C3, but also C1, can discharge to ground AC voltage components originating in particular from a DC/DC converter which is not shown in FIGS. 1 and 2 (but see FIG. 3) and which is connected to the output 3. The inductor L, on the other hand, blocks high frequencies and acts as a "current straightening" entity.

Figure 3:
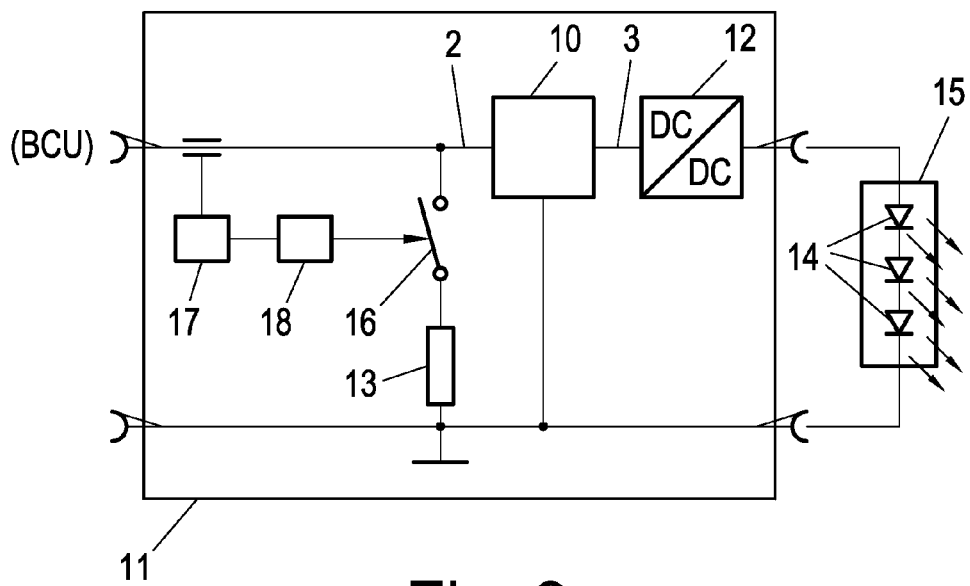
FIG. 3 shows a control module according to various embodiments having such a filter device for controlling an LED array for a light in a motorized vehicle.

FIG. 3 shows a control module 11 having a filter device 10 roughly according to FIG. 2 whose input 2 simultaneously forms an input that is to be connected, for example, to a BCU control unit that is not shown in further detail. The output 3 of the filter device 10 is connected to a direct-current converter (DC/DC converter) 12, and a load resistor 13 is provided in a shunt circuit at the input 2.

The DC/DC converter 12 serves for supplying power to LEDs 14 which are arranged in an array 15.

The resistor 13 can be connected to the current path (see item 4 in FIG. 2) with the aid of a—preferably electronic—switch 16 if too low a current (e.g. due to a rapid drop in the supply voltage) is detected with the aid of a measuring device 17. A driver circuit 18, which is controlled via the current in the example shown, is provided for connecting and activating the resistor 13. As a result of said connection and activation of the resistor 13, a minimum current is ensured when necessary, i.e. to prevent too small a current (undercurrent) being detected by the BCU control unit or, as the case may be, a line break or the like being diagnosed by reason of such an undercurrent, or a fault code being entered, which can lead to critical situations in particular if a lighting means is switched off due to said erroneous detection, leading in consequence to the lighting of a motorized vehicle being switched off (and this being done even though the lighting and in particular also the cable to the lighting system are in working order).

By means of the present filter device 10, with the specific arrangement of the individual filter components, it is therefore possible successfully to bridge any short time intervals during the activation of the resistor 13 in the event that at precisely that time instant a current measurement should be performed which is evaluated in the control unit (BCU) and which, without further measures, would possibly lead to an undesired disconnection of the power supply to the LED array 16.

What is claimed is:

1. A filter device for filtering high-frequency interference, comprising:
   a current path between an input and an output;
   an inductor provided as the first component in the current path and connected to the input;
   an inverse-polarity protection diode connected in series with and downstream of the inductor; and
   a voltage buffer and bypass capacitor connected in series with and downstream of the inductor and the inverse-polarity protection diode, the voltage buffer and bypass capacitor having a equivalent series resistance above 200 mΩ;
   a first filter capacitor provided in a first branch path connected to the current path at a point between the input and the inductor; and
   a second filter capacitor provided in a second branch path connected to the current path at a point between the inductor and the output;
   wherein each of the first and second filter capacitors provide a substantially smaller capacitance than the voltage buffer and bypass capacitor.

2. The filter device according to claim 1, wherein the second branch path including the second filter capacitor is to the current path at a point the downstream of the protection diode.

3. The filter device according to claim 1, wherein a resistor guaranteeing a minimum current is connected to the filter device.

4. A control module comprising:
   a filter device for filtering high-frequency interference, said filter device comprising:
      a current path between an input and an output;
      an inductor provided as the first component in the current path and connected to the input; and
      an inverse-polarity protection diode is connected in series with and downstream of the inductor:
   a shunt circuit branching from the current path of the filter device and including a resistor selectively connectable to the current path by a switch, the resistor ensuring a minimum current after an inherent activation time of the resistor upon activation of the switch; and
   a driver circuit configured to activate the switch to connect the resistor to the current path in response to a rapid drop in a supply voltage;
   wherein the filter device is configured to ensure a predefined minimum current level at all times during the inherent activation time of the resistor when the switch is activated;
   a DC/DC converter that is connected to the output of the filter device.

5. The control module according to claim 4, wherein a voltage buffer and bypass capacitor is connected downstream of the protection diode.

6. The control module according to claim 4, wherein a filter capacitor is connected to the input-side terminal of the inductor and defines a branch path of the filter device.

7. The control module according to claim 6, wherein a further filter capacitor is provided in a further branch path of the filter device connecting to the current path downstream of the inductor.

8. The control module according to claim 6, wherein a further filter capacitor is provided in a further branch path of the filter device connecting to the current path downstream of the inductor, and wherein the further filter capacitor is connected at the downstream end of the protection diode.

9. A system, comprising:
a direct current converter configured for controlling of lighting means, the direct current converter including a converter input;
a filter device configured to filter high frequency electromagnetic interference, the filter device including a current path from a filter input to a filter output;
the filter output connected to the converter input;
an inductor connected to the filter input as the first component in the current path;
an inverse-polarity protection diode connected in series with and downstream of the inductor:
wherein the filter device further comprises a shunt circuit at the filter input or the filter output connectable to the current path by a switch to ensure a minimum current when connected, the shunt circuit including a resistor; and
a driver circuit configured to activate the switch to connect the resistor to the current path in response to a rapid drop in a supply voltage.

\* \* \* \* \*